United States Patent
Lee et al.

(10) Patent No.: US 8,043,970 B2
(45) Date of Patent: Oct. 25, 2011

(54) SLURRY COMPOSITIONS FOR SELECTIVELY POLISHING SILICON NITRIDE RELATIVE TO SILICON OXIDE, METHODS OF POLISHING A SILICON NITRIDE LAYER AND METHODS OF MANUFACTURING A SEMICONDUCTOR DEVICE USING THE SAME

(75) Inventors: Jong-Won Lee, Seongnam-si (KR); Sang-Yeob Han, Anyang-si (KR); Chang-Ki Hong, Seongnam-si (KR); Jae-Dong Lee, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 674 days.

(21) Appl. No.: 12/167,781

(22) Filed: Jul. 3, 2008

(65) Prior Publication Data
US 2009/0011599 A1  Jan. 8, 2009

(30) Foreign Application Priority Data
Jul. 6, 2007  (KR) ........................ 10-2007-0067842

(51) Int. Cl.
*H01L 21/302* (2006.01)
*H01L 21/461* (2006.01)
*B24D 3/02* (2006.01)
*C09C 1/68* (2006.01)

(52) U.S. Cl. ............ 438/693; 51/307; 51/308; 438/691; 438/692

(58) Field of Classification Search .................. 51/298, 51/308, 307; 451/41; 438/693, 633, 691, 438/692
See application file for complete search history.

(56) References Cited

U.S. PATENT DOCUMENTS
| | | | |
|---|---|---|---|
| 6,239,032 B1* | 5/2001 | Nakamura et al. ............ 438/693 |
| 6,746,314 B2* | 6/2004 | Kim et al. ........................ 451/41 |
| 2004/0132305 A1* | 7/2004 | Nishimoto et al. ........... 438/690 |

FOREIGN PATENT DOCUMENTS
| | | |
|---|---|---|
| JP | 2004-273547 | 9/2004 |
| JP | 2006-120728 | 5/2006 |
| KR | 10-2004-0055042 | 6/2004 |

OTHER PUBLICATIONS
Machine translation of JP 2004-273547 (Sep. 3, 2004).*

* cited by examiner

*Primary Examiner* — Anthony Green
*Assistant Examiner* — Pegah Parvini
(74) *Attorney, Agent, or Firm* — F. Chau & Associates, LLC

(57) ABSTRACT

Slurry compositions for selectively polishing silicon nitride relative to silicon oxide, methods of polishing a silicon nitride layer and methods of manufacturing a semiconductor device using the same are provided. The slurry compositions include a first agent for reducing an oxide polishing rate, an abrasive particle and water, and the first agent includes poly(acrylic acid). The slurry composition may have a high polishing selectivity of silicon nitride relative to silicon oxide to be employed in selectively polishing a silicon nitride layer in a semiconductor manufacturing process.

9 Claims, 13 Drawing Sheets

SLURRY COMPOSITIONS FOR SELECTIVELY POLISHING SILICON NITRIDE RELATIVE TO SILICON OXIDE, METHODS OF POLISHING A SILICON NITRIDE LAYER AND METHODS OF MANUFACTURING A SEMICONDUCTOR DEVICE USING THE SAME

PRIORITY STATEMENT

This application claims priority under 35 U.S.C. §119 to Korean Patent Application No. 2007-67842, filed on Jul. 6, 2007, the contents of which are hereby incorporated by reference herein in their entirety.

BACKGROUND OF THE INVENTION

1. Technical Field

Exemplary embodiments of the present invention relate to slurry compositions for selectively polishing silicon nitride relative to silicon oxide, methods of polishing a silicon nitride layer and methods of manufacturing a semiconductor device using the same. Particularly, exemplary embodiments of the present invention relate to slurry compositions for selectively polishing silicon nitride relative to silicon oxide that may be employed in a semiconductor manufacturing process, methods of polishing a silicon nitride layer and methods of manufacturing a semiconductor device using the same 2. Description of the Related Art A semiconductor manufacturing process generally includes forming a layer such as an insulation layer or a conductive layer on a substrate, planarizing a surface of the layer, etching the layer to form a pattern having a predetermined shape, or the like.

A process for planarizing a layer may be, for example, an etch-back process, a reflow process, a chemical mechanical polishing (CMP) process or the like. The CMP process is widely used for global planarization or for forming a highly integrated circuit device, as the global planarization may only be achieved by the CMP process and the CMP process has excellent planarization quality.

In the CMP process, a semiconductor wafer to be polished is mounted on a chuck, a slurry composition including an abrasive is provided between the semiconductor wafer and a polishing pad, and then the semiconductor wafer is rotated and pressed against the polishing pad so that the semiconductor wafer is planarized. The semiconductor wafer is mechanically polished by rubbing a surface of the semiconductor wafer with the abrasive and the polishing pad, and also chemically removed by a chemical reaction between chemical components of the slurry composition and the surface of the semiconductor wafer.

The polishing efficiency of the CMP process may be determined by the type of a CMP apparatus, components of the slurry composition, the type of the polishing pad and the like. Among several factors, the components of the slurry composition may have an influence on the polishing efficiency. With regard to the polishing efficiency, the slurry composition should be able to rapidly polish an object, and also should not be able to cause damage to several structures adjacent to the object to be polished.

Commercial slurry compositions have been mainly employed in polishing a silicon oxide layer using a silicon nitride layer as a polishing stop layer, because the slurry compositions exhibit a polishing rate of a silicon oxide layer substantially faster than the polishing rate of a silicon nitride layer. When such slurry compositions are used in polishing a silicon nitride layer, the polishing efficiency may decrease due to a low polishing rate of silicon nitride, and a silicon oxide layer which may be exposed during the polishing process can be unintentionally damaged. Additionally, the slurry compositions may not be expected to have a high quality of planarization and uniformity for a silicon nitride layer, and there also may be difficulty in determining a polishing stop point.

SUMMARY OF THE INVENTION

Exemplary embodiments of the present invention may provide slurry compositions for selectively polishing silicon nitride relative to silicon oxide.

Exemplary embodiments of the present invention may also provide methods of polishing a silicon nitride layer using the slurry compositions.

Exemplary embodiments of the present invention may also provide methods of manufacturing a semiconductor device using the slurry compositions.

In accordance with an exemplary embodiment of the present invention, a slurry composition, used for selectively polishing silicon nitride relative to silicon oxide is provided. The slurry composition includes a first agent for reducing an oxide polishing rate, an abrasive particle and water. The first agent includes poly(acrylic acid).

In an exemplary embodiment of the present invention, the slurry composition may have a pH in a range of about 1 to about 4.

In an exemplary embodiment of the present invention, the slurry composition may include about 0.01 to about 10% by weight of the first agent, about 0.01 to about 10% by weight of the abrasive particle and a remainder of water.

In an exemplary embodiment of the present invention, the slurry composition may further include a second agent for reducing an oxide polishing rate that has a peroxide compound. In exemplary embodiments, the slurry composition may include about 0.01 to about 10% by weight of the first agent, about 0.1 to about 30% by weight of the second agent, about 0.01 to about 10% by weight of the abrasive particle and a remainder of water.

In an exemplary embodiment of the present invention, the slurry composition may include a ceria abrasive particle. In some exemplary embodiments, the amount of the ceria abrasive particle may be in a range of about 0.01 to about 1% by weight based on a total weight of the slurry composition. In other exemplary embodiments, the amount of the ceria abrasive particle may be in a range of about 0.01 to about 0.6% by weight. In an exemplary embodiment, the ceria abrasive particle may have a primary particle of an average diameter in a range of about 5 to about 200 nm, and a secondary particle of an average diameter in a range of about 50 to about 1,000 nm.

In accordance with an exemplary embodiment of the present invention, a method of polishing a silicon nitride layer is provided. In the method, a silicon nitride layer is formed on a substrate having a silicon oxide layer. The silicon nitride layer is polished by using the silicon oxide layer as a polishing stop layer and applying to the substrate a slurry composition including a first agent for reducing an oxide polishing rate, an abrasive particle and water. The first agent includes poly(acrylic acid), In accordance with exemplary embodiment of the present invention, a method of manufacturing a semiconductor device is provided. In the method, a first silicon nitride layer pattern is formed on a substrate to have a length extending along the substrate in a first direction. The substrate is partially etched using the first silicon nitride layer pattern as an etching mask to form a trench at an upper portion of the substrate. A silicon oxide layer is formed to fill the trench and to define an active region of the substrate. A portion of the silicon oxide layer adjacent to both ends of the active region in the first direction is removed to form a recess in the silicon oxide layer. A second silicon nitride layer is formed on the first silicon nitride layer pattern and the silicon oxide layer to fill the recess. The second silicon nitride layer is polished using a slurry composition until the silicon oxide layer is exposed to form a second silicon nitride layer pattern that fills the recess. The slurry composition includes a first agent for reducing an oxide polishing rate, an abrasive particle and water. The first agent includes poly(acrylic acid).

According to exemplary embodiments of the present invention, the slurry compositions including agents for reducing an oxide polishing rate may have a polishing rate of silicon nitride at least about five times to about at least twenty times faster than a polishing rate of silicon oxide. Therefore, the slurry composition may be employed in polishing a silicon nitride layer relative to a silicon oxide layer in a semiconductor manufacturing process. The slurry composition may suppress or reduce damage to the silicon oxide layer while the silicon nitride layer being polished, and may also improve the surface planarity and the polishing uniformity of the silicon nitride layer.

BRIEF DESCRIPTION OF THE DRAWINGS

Exemplary embodiments of the present invention can be understood in more detail from the following description taken in conjunction with the accompanying drawings, in which.

DETAILED DESCRIPTION OF THE EXEMPLARY EMBODIMENTS OF THE INVENTION

Figure 1A:
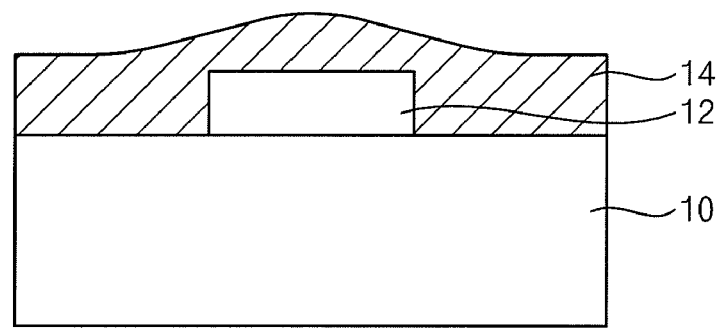
FIGS. 1A and 1B are cross-sectional views illustrating a method of polishing a silicon nitride layer according to an exemplary embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Slurry Compositions for Polishing Silicon Nitride

According to exemplary embodiments of the present invention, a slurry composition includes an agent for reducing an oxide polishing rate, an abrasive particle and water. The slurry composition may have an improved polishing selectivity of silicon nitride relative to silicon oxide. Thus, the slurry composition may polish a silicon nitride layer selectively and may suppress damage to a silicon oxide layer.

In exemplary embodiments, the slurry composition includes poly(acrylic acid) as a first agent for reducing an oxide polishing rate. Poly(acrylic acid) may greatly reduce a polishing rate of silicon oxide relative to a polishing rate of silicon nitride.

In an exemplary embodiment, when the slurry composition includes less than about 0.01 wt % of the first agent, the polishing rate of silicon oxide may slightly decrease and the selective polishing of silicon nitride relative to silicon oxide may not be properly performed. Additionally, in an exemplary embodiment, although the slurry composition includes greater than about 10 wt % of the first agent, the polishing rate of silicon oxide may not substantially decrease any more. In some exemplary embodiments, the slurry composition may include about 0.01 to about 10 wt % of the first agent. In other exemplary embodiments, the slurry composition may include about 0.1 to about 0.5 wt % of the first agent.

Examples of the first agent for reducing an oxide polishing rate, which may be used in the slurry composition, may include but are not limited to a homopolymer of poly(acrylic acid) or a copolymer of poly(acrylic acid) and other types of a polymer such as a vinyl resin, an acryl resin, an alkylene oxide resin, an olefin resin or the like. In some example embodiments, poly(acrylic acid) may have a weight-average molecular weight in a range of about 1,000 to about 1,000,000. In other example embodiments, poly(acrylic acid) may have a weight-average molecular weight in a range of about 1,000 to about 500,000. The molecular weight of the first agent may be properly adjusted to improve dispersibility and/or viscosity of the slurry composition.

In exemplary embodiments of the present invention, the slurry composition includes an abrasive particle. Examples of the abrasive particle may include but are not limited to ceria, silica, alumina, zirconia, titania, germania and the like, which may be used alone or in a combination thereof. In some embodiments, the slurry composition may include a ceria abrasive particle to enhance a polishing rate of silicon nitride.

In an exemplary embodiment, the amount of the abrasive particle that may be included in the slurry composition may be changed according to the polishing rate, dispersibility of slurry and/or a planarity of a polished object. In some embodiments, the amount of the abrasive particle may be in a range of about 0.01 to about 10 wt %.

In an exemplary embodiment, the slurry composition may include a ceria abrasive particle. When the amount of the ceria abrasive particle is less than about 0.01 wt %, the mechanical polishing effect of the abrasive particle may be small and the polishing efficiency may decrease. When the amount of ceria abrasive is greater than about 1 wt %, the polishing rate of silicon oxide may increase and the polishing rate of silicon nitride may decrease. Thus, the polishing selectivity of silicon nitride relative to silicon oxide may be reduced. In some example embodiments, the slurry composition may include the ceria abrasive particle in a range of about 0.01 to about 1 wt %. In other example embodiments, the amount of the ceria abrasive particle may be in a range of about 0.01 to about 0.6 wt %.

In an exemplary embodiment, the ceria abrasive particle may have a primary particle (e.g., grain or crystallite) of an average diameter in a range of about 5 to about 200 nm, and a second particle of an average diameter in a range of about 50 to about 1,000 nm, which may thereby enhance the polishing selectivity of silicon nitride relative to silicon oxide.

In exemplary embodiments of the present invention, the slurry composition may additionally include a peroxide compound as a second agent for reducing an oxide polishing rate. The second agent may suppress polishing of silicon oxide and increase the polishing selectivity of silicon nitride. Examples of the peroxide compound may include but are not limited to hydrogen peroxide, benzoyl peroxide, calcium peroxide, barium peroxide, sodium peroxide, urea hydrogen peroxide, percarbonate, peracetic acid, di-t-butyl peroxide, monopersulfate, potassium peroxide, periodic acid, periodate salt, perbromate salt, perchloric acid, perchlorate salt, perboric acid, perborate salt, permanganate salt or combinations thereof.

The amount of the second agent for reducing an oxide polishing rate may be changed to enhance the polishing selectivity of silicon nitride. In some embodiments, the amount of the second agent may be in a range of about 0.1 to about 30 wt %. In other embodiments, the amount of the second agent may be in a range of about 0.5 to about 5 wt %.

In exemplary embodiments of the present invention, the slurry composition may have a pH of about 1 to about 4. When the pH of the slurry composition is higher than about 4, the polishing rate of silicon oxide may be fast and the polishing selectivity of silicon nitride may be low. In some embodiments, the pH of the slurry composition may be lower than or equal to about 4. In other embodiments, the pH of the slurry composition may be lower than or equal to about 3.

In an exemplary embodiment of the present invention, the slurry composition may additionally include a pH-controlling agent so that the slurry composition may have a proper pH range. Examples of the pH-controlling agent may include but are not limited to an inorganic acid, an organic acid, a basic compound or the like. Examples of the inorganic acid may include but are not limited to sulfuric acid, hydrochloric acid, phosphoric acid, nitric acid or the like. Examples of the organic acid may include but are not limited to a carboxylic acid, a dicarboxylic acid or the like. Examples of the basic compound may include but are not limited to ammonium hydroxide, potassium hydroxide, sodium hydroxide, an organic ammonium hydroxide or the like.

In an exemplary embodiment of the present invention, the slurry composition may additionally include a dispersion stabilizing agent to improve dispersibility and storing stability of the slurry composition. Examples of the dispersion stabilizing agent may include but are limited to a carboxylic acid, a carboxylic acid salt, a surfactant or the like. Examples of the carboxylic acid may include but are limited to acetic acid, propionic acid, butyric acid, citric acid, oxalic acid, succinic acid, glutaric acid, malic acid or the like. Examples of the surfactant may include but are not limited to an anionic surfactant such as a sulfuric ester, a sulfuric ester salt, a sulfonic acid, a sulfonic acid salt, a phosphoric ester or a phosphoric ester salt; a cationic surfactant such as a primary amine, a primary amine salt, a secondary amine, a secondary amine salt, a tertiary amine, a tertiary amine salt, a quaternary ammonium or a quaternary ammonium salt; or a nonionic surfactant such as a polyethylene glycol-based surfactant or a polyhydroxy alcohol-based surfactant. The amount of the dispersion stabilizing agent may be adjusted to enhance dispersibility of the abrasive particle. In some embodiments, the dispersion stabilizing agent may be used in a range of about 0.001 to about 10 wt %. In other embodiments, the amount of the dispersion stabilizing agent may be in a range of about 0.001 to about 0.1 wt %.

According to exemplary embodiments of the present invention, the slurry composition including agents for reducing an oxide polishing rate may have a polishing rate of silicon nitride of about at least five times to about at least twenty times faster than a polishing rate of silicon oxide. Therefore, the slurry composition may be employed in polishing a silicon nitride layer relative to a silicon oxide layer in a semiconductor manufacturing process. The slurry composition may suppress or reduce damage to the silicon oxide layer while the silicon nitride layer being polished, and may also improve the surface planarity and the polishing uniformity of the silicon nitride layer.

Exemplary embodiments with regard to methods of polishing a silicon nitride layer and methods of manufacturing a semiconductor device will be described with reference to the accompanying drawings, hereinafter.

Method of Polishing a Silicon Nitride

Figure 1B:
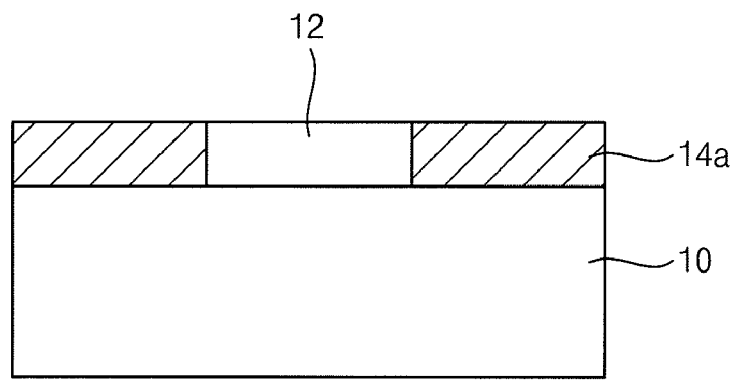

FIGS. 1A and 1B are cross-sectional views illustrating a method of polishing a silicon nitride layer according to some exemplary embodiments of the present invention.

Referring to FIG. 1A, a silicon nitride layer 14 is formed on a substrate 10 on which a silicon oxide layer 12 is formed. In some embodiments, the silicon nitride layer 14 may be formed on the substrate 10 to cover the silicon oxide layer 12. In other embodiments, a top surface of the silicon nitride layer 14 may be formed to be higher than a top surface of the silicon oxide layer 12.

In example embodiments, the silicon oxide layer 12 may be formed by, for example, a thermal oxidation process, a chemical vapor deposition (CVD) process, an atomic layer deposition (ALD) process or the like, and the silicon nitride layer 14 may be formed by, for example, a CVD process, a low-pressure CVD process, a plasma-enhanced CVD process, an ALD process, a sputtering process or the like.

Referring to FIG. 1B, the silicon nitride layer 14 is polished by applying to the substrate 10 a slurry composition according to exemplary embodiments of the present invention.

In exemplary embodiments, a slurry composition including an agent for reducing an oxide polishing rate, an abrasive particle and water may be provided to a polishing pad. A surface of the silicon nitride layer 14 may be chemically and mechanically polished by contacting the silicon nitride layer 14 with the polishing pad. The slurry composition has already been previously described, so any further explanations will be omitted herein for brevity.

In some embodiments, the silicon nitride layer 14 may be polished until the silicon oxide layer 12 is exposed. As a result, a silicon nitride layer pattern 14a may be formed on the substrate 10. In other embodiments, the silicon nitride layer 14 may be polished using the silicon oxide layer 12 as a polishing stop layer. The slurry composition according to exemplary embodiments may have both a low polishing rate of silicon oxide and a high polishing rate of silicon nitride, and thus the silicon nitride layer 14 may be polished without causing severe damage to the silicon oxide layer 12.

Figure 2A:
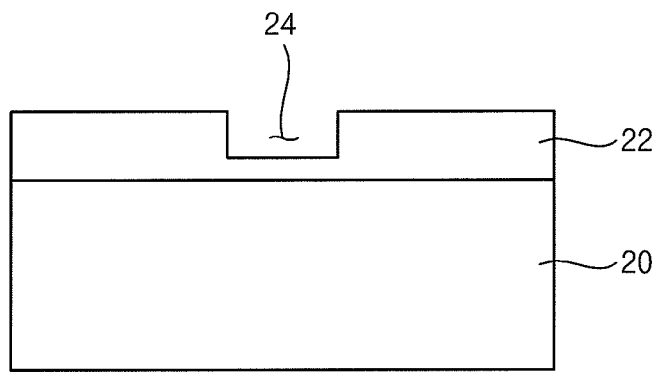
FIGS. 2A through 2C are cross-sectional views illustrating a method of polishing a silicon nitride layer according to an exemplary embodiment of the present invention.
Figure 2B:
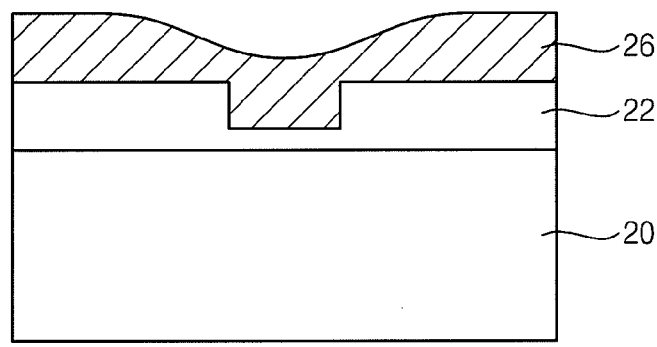
Figure 2C:
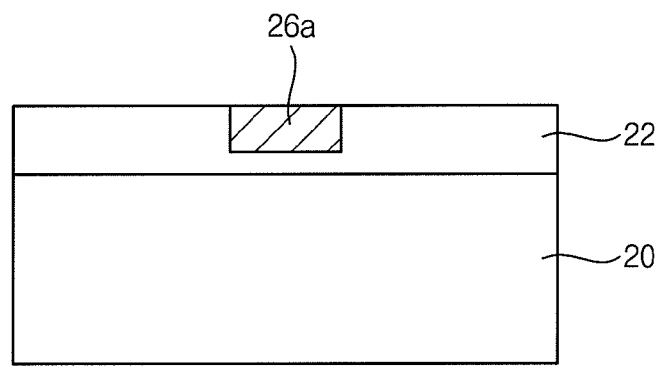

FIGS. 2A through 2C are cross-sectional views illustrating a method of polishing a silicon nitride layer according to other exemplary embodiments of the present invention.

Referring to FIG. 2A, a substrate 20 on which a silicon oxide layer 22 having a recess 24 is formed is prepared. A bottom of the recess 24 is substantially lower than a top surface of the silicon oxide layer, and the width and the depth of the recess 24 may not be limited specifically. In exemplary embodiments, the recess 24 of the silicon oxide layer 22 may be formed by, for example, performing a photolithography process.

Referring to FIG. 2B, a silicon nitride layer 26 is formed on the silicon oxide layer 24 to fill the recess 24. In exemplary embodiments, the silicon nitride layer 26 may be formed by, for example, a CVD process, a low-pressure CVD process, a plasma-enhanced CVD process, an ALD process, a sputtering process or the like.

Referring to FIG. 2C, the silicon nitride layer 26 is polished using a slurry composition according to exemplary embodiments of the present invention. In some exemplary embodiments, the silicon nitride layer 26 may be polished until the silicon oxide layer 22 is exposed to form a silicon nitride layer pattern 26a filling the recess 24. The silicon nitride layer 26 may be polished by performing processes substantially the same as those described with reference to FIG. 1B.

According to exemplary embodiments, the silicon nitride layer may be polished using the slurry composition, which may have a high polishing selectivity of silicon nitride relative to silicon oxide. Therefore, the silicon nitride layer may be polished with improved surface planarity and uniformity, and damage to the silicon oxide layer may be reduced.

Method of Manufacturing a Semiconductor Device

FIGS. 3 through 13 are views illustrating a method of manufacturing a semiconductor device according to still other exemplary embodiments of the present invention. In the drawings, FIGS. 5A, 6A, 7A, 8A, 9A, 10A and 11A are cross-sectional views taken along the line X1-X2 in FIG. 4, and FIGS. 5B, 6B, 7B, 8B, 9B, 10B and 11B are cross-sectional views taken along the line Y1-Y2 in FIG. 4.

Figure 3:
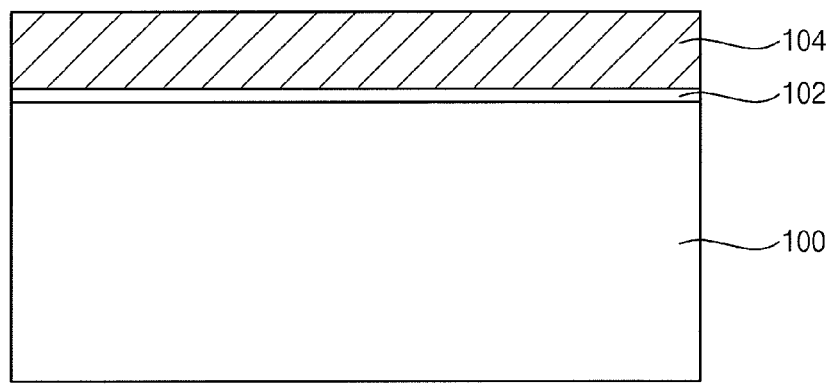
FIGS. 3 through 13 are views illustrating a method of manufacturing a semiconductor device according to an exemplary embodiment of the present invention.

FIG. 3 is a cross-sectional view illustrating a pad oxide layer and a first silicon nitride layer formed on a substrate.

Referring to FIG. 3, a pad oxide layer 102 and a first silicon nitride layer 104 are sequentially formed on a substrate 100. In exemplary embodiments, the pad oxide layer 102 may be formed by, for example, a thermal oxidation process or a CVD process, and the first silicon nitride layer 104 may be formed by a low-pressure CVD process or a plasma-enhanced CVD process using dichlorosilane ($SiH_2Cl_2$) gas, silane ($SiH_4$) gas, ammonia ($NH_3$) gas and the like.

Figure 4:
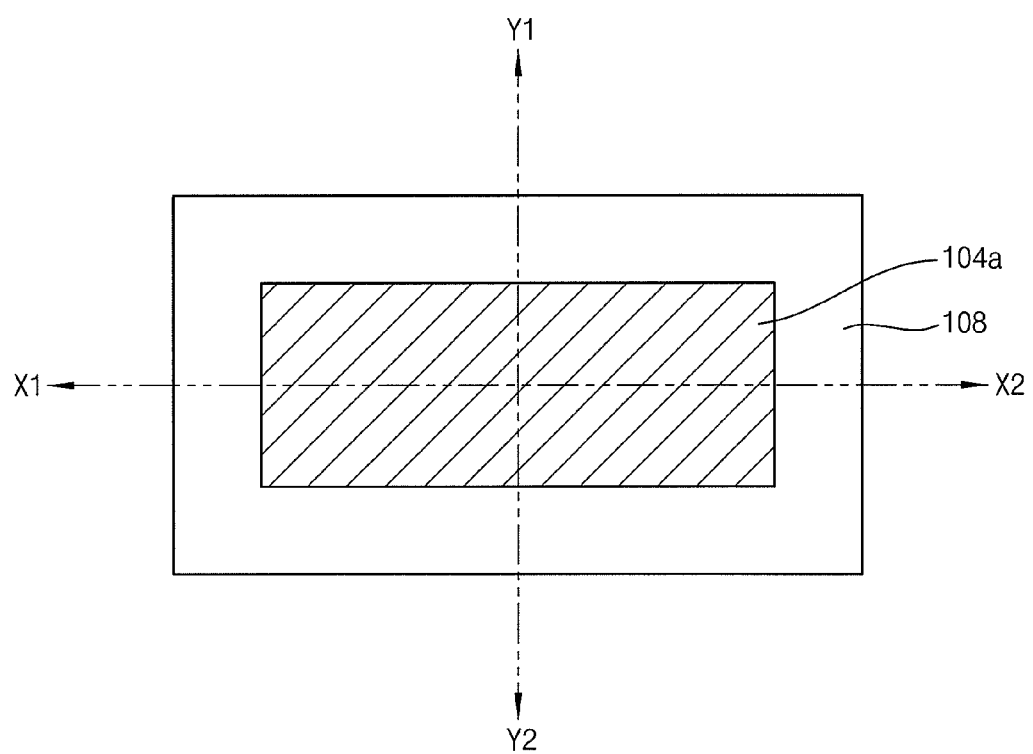
Figure 5A:
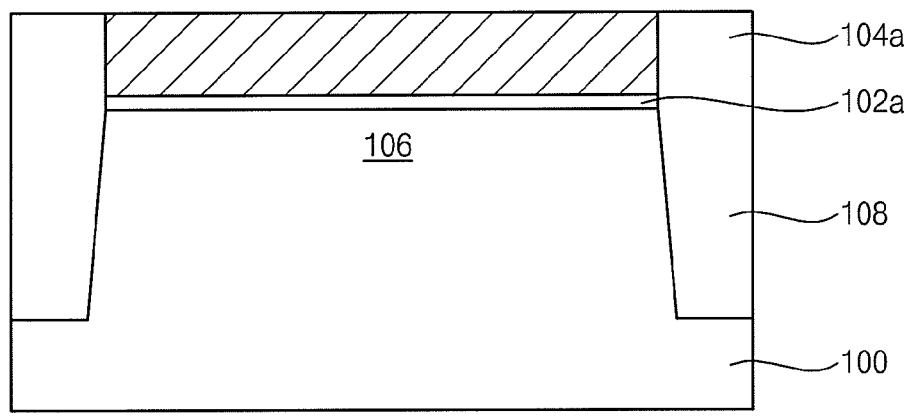
Figure 5B:
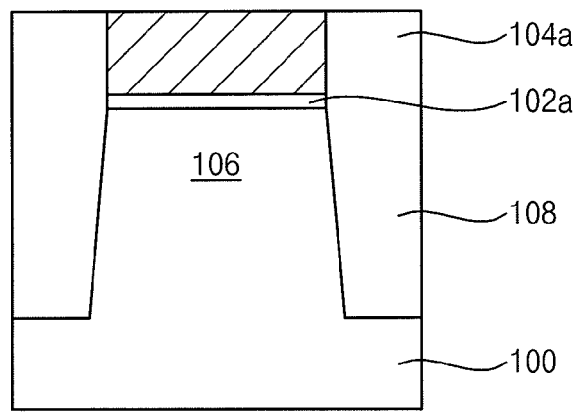

FIG. 4 is a plan view illustrating a silicon oxide layer defining an active region of a substrate. FIGS. 5A and 5B are cross-sectional views illustrating the silicon oxide layer defining the active region.

Referring to FIGS. 4, 5A and 5B, the first silicon nitride layer 104 and the pad oxide layer 102 are patterned to form a pad oxide layer pattern 102a and a first silicon nitride layer pattern 104a on substrate 100. The first silicon nitride layer pattern 104a may have a length extending along the substrate 100 in a first direction parallel to the line X1-X2. The first silicon nitride layer pattern may be served as an etching mask for forming an active region 106 of the substrate 100.

In an exemplary embodiment, a first photoresist pattern may be formed on the first silicon nitride layer 104 to have an opening extending along the first direction. The first silicon nitride layer 104 and the pad oxide layer 102 are sequentially etched using the first photoresist pattern as an etching mask to form a first silicon nitride layer pattern 104a and a pad oxide layer pattern 102a on the substrate 100.

The substrate 100 is partially etched using the first silicon nitride layer pattern 104a and the pad oxide layer pattern 102a as etching masks to form a trench at an upper portion of the substrate 100. A silicon oxide layer 108 is formed on the substrate 100 to fill the trench and to define an active region 106 of the substrate 100.

Figure 6A:
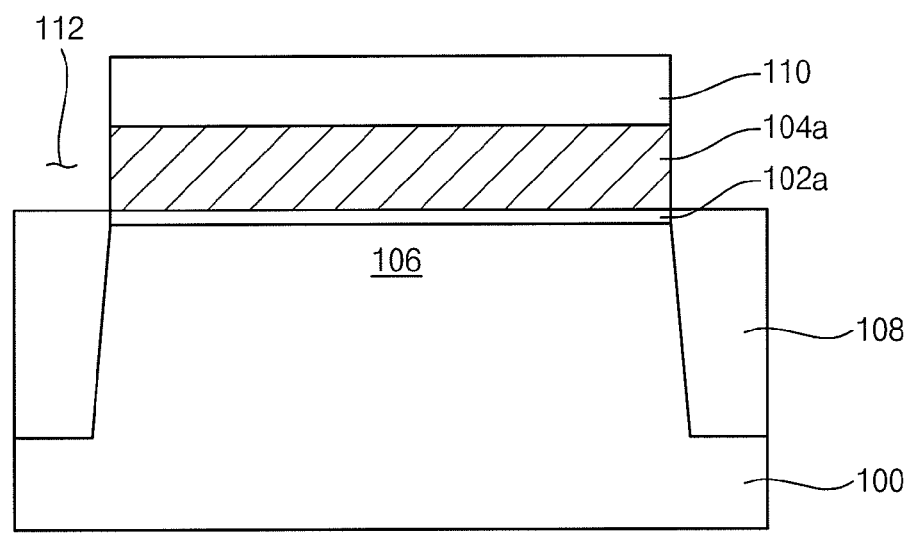
Figure 6B:
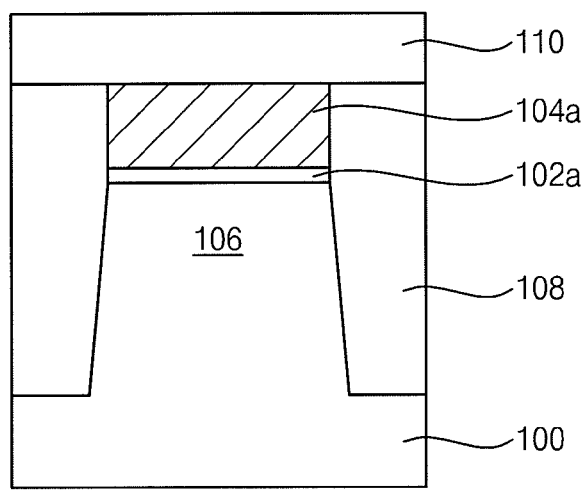

FIGS. 6A and 6B are cross-sectional views illustrating a recess formed in the silicon oxide layer.

Referring to FIGS. 6A and 6B, a photoresist film is formed on the first silicon nitride layer pattern 104a and the silicon oxide layer 108. An exposure process and a developing process are carried out on the photoresist film to form a second photoresist pattern 110 having an opening that exposes both ends of the silicon oxide layer 108 adjacent to the active region 106 in the first direction.

The exposed portion of the silicon oxide layer 108 is etched using the second photoresist pattern 110 as an etching mask to form a recess 112 in the silicon oxide layer 108. The second photoresist pattern 110 may be removed by performing an ashing process and/or a stripping process.

Figure 7A:
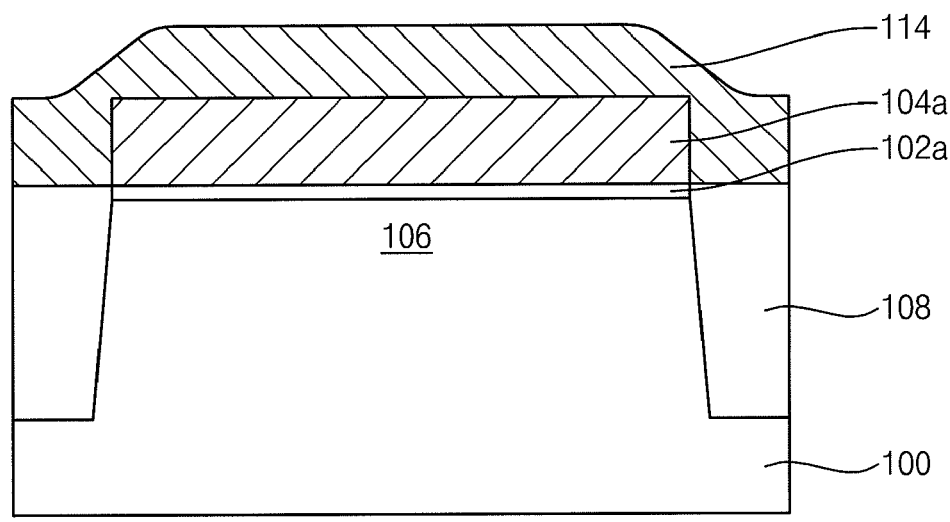
Figure 7B:
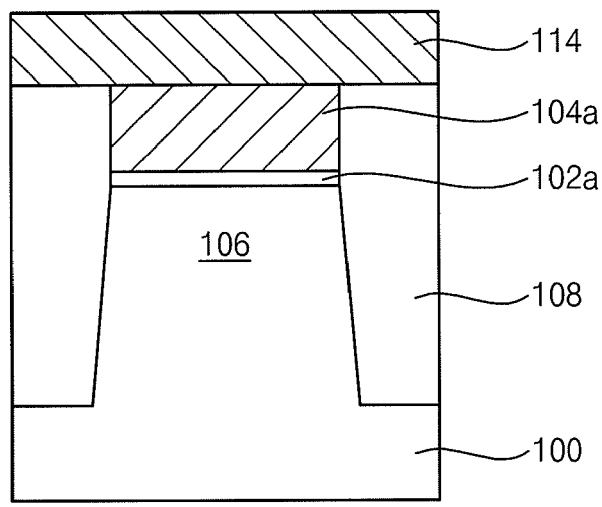

FIGS. 7A and 7B are cross-sectional views illustrating a second silicon nitride layer formed on the first silicon nitride layer pattern and the silicon oxide layer to fill the recess.

Referring to FIGS. 7A and 7B, a second silicon nitride layer 114 is formed on the first silicon nitride layer pattern 104a and the silicon oxide layer 108 to fill the recess 112. In an exemplary embodiment, the second silicon nitride layer 114 may be formed using a material substantially the same as the material of the first silicon nitride layer pattern 104a. For example, the second silicon nitride layer 114 may be formed by a low-pressure CVD process or a plasma-enhanced CVD process using $SiH_2Cl_2$ gas, $SiH_4$ gas, $NH_3$ gas and the like.

Figure 8A:
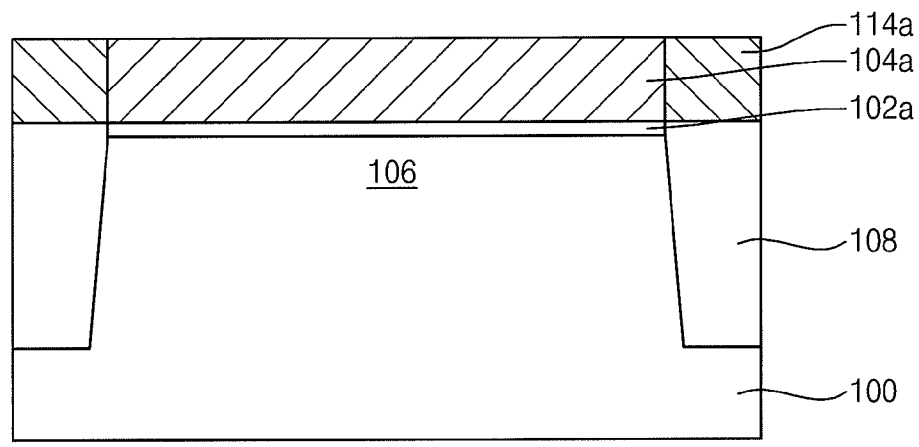
Figure 8B:
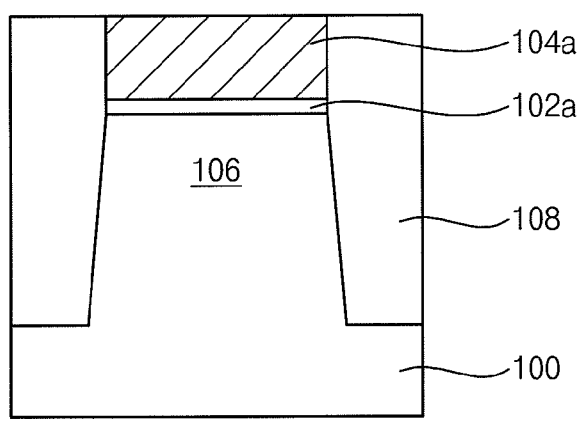

FIGS. 8A and 8B are cross-sectional views illustrating a second silicon nitride layer pattern formed by a polishing process to fill the recess.

Referring to FIGS. 8A and 8B, the second silicon nitride layer 114 is polished until the silicon oxide layer 108 is exposed to form a second silicon nitride layer pattern 114a that fills the recess 112. Polishing the second silicon nitride layer 114 may be performed using a slurry composition according to exemplary embodiments of the present invention. The slurry composition includes an agent for reducing an oxide polishing rate, an abrasive particle and water. The slurry composition may have a high polishing selectivity of silicon nitride relative to silicon oxide. Accordingly, the second silicon nitride layer 114 may be polished using the silicon oxide layer 108 as a polishing stop layer. The second silicon nitride layer pattern 114a formed to fill the recess 112 may protect or prevent damage to the silicon oxide layer 108 adjacent to both ends of the active region 106 in the first direction.

Figure 9A:
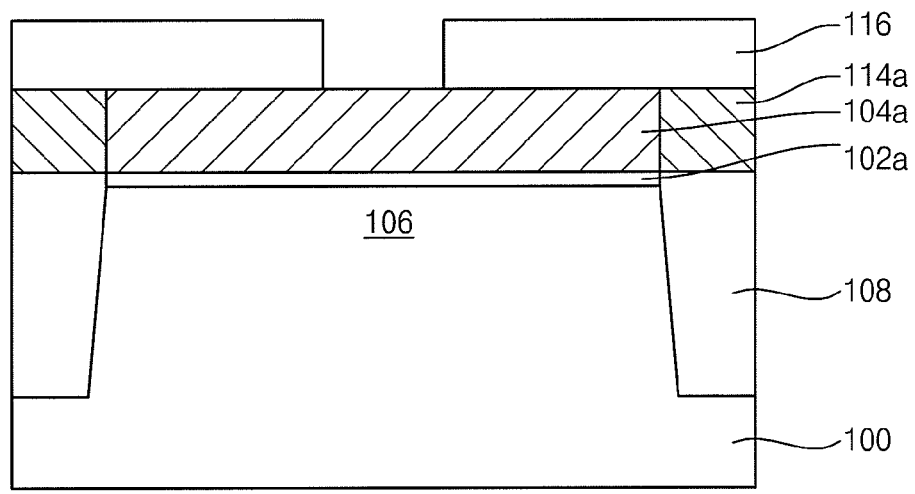
Figure 9B:
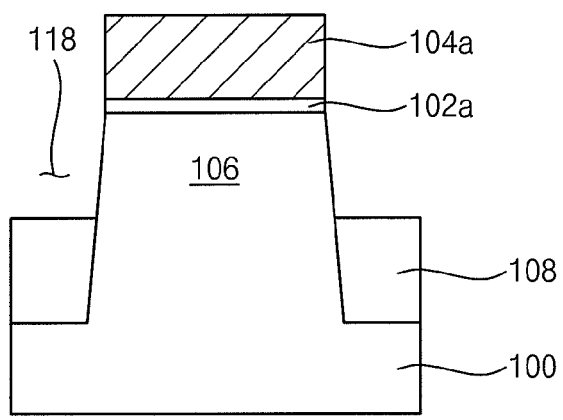

FIGS. 9A and 9B are cross-sectional views illustrating a first opening that partially exposes sidewalls of the active region of the substrate in a second direction parallel to the line Y1-Y2.

Referring to FIGS. 9A and 9B, a third photoresist pattern 116 is formed on the first silicon nitride layer pattern 104a, the second silicon nitride layer pattern 114a and the silicon oxide layer 108. The third photoresist pattern 116 extends in a second direction substantially perpendicular to the first direction, and has an opening that extends in the second direction and exposes portions of the first silicon nitride layer pattern 104a and the silicon oxide layer 108.

The exposed portion of the silicon oxide layer 108 is removed using the third photoresist pattern 116 and the first silicon nitride layer pattern 104a as etching masks to form a first opening 118 that partially exposes sidewalls of the active region 106 of the substrate 100 in a second direction. In an exemplary embodiment, the first opening 118 may be formed by performing a dry etching process.

Figure 10A:
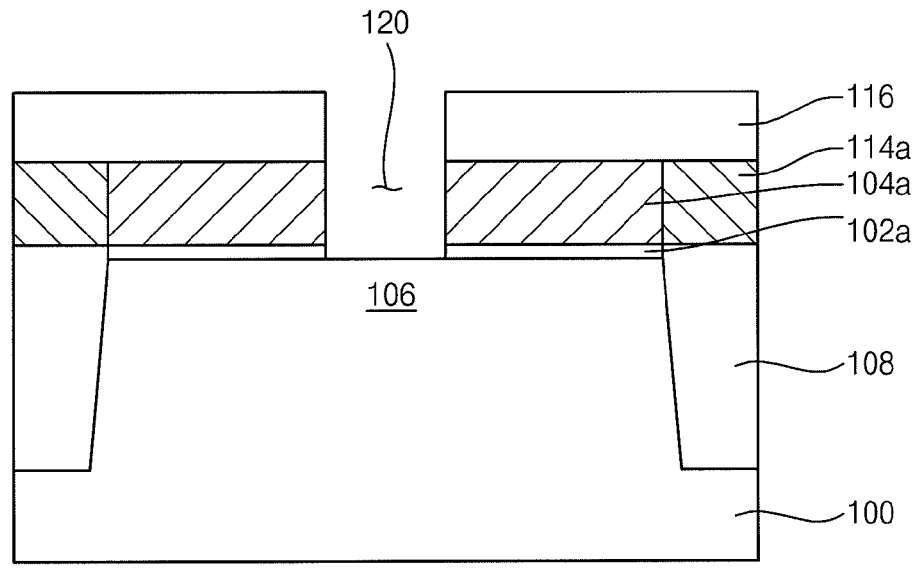
Figure 10B:
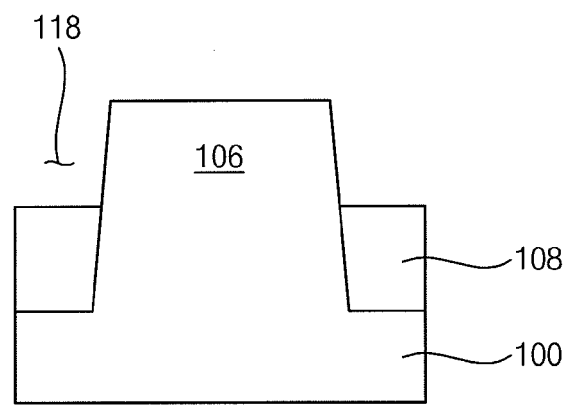

FIGS. 10A and 10B are cross-sectional views illustrating a second opening that partially exposes a top surface of the active region.

Referring to FIGS. 10A and 10B, the first silicon nitride layer pattern 104a and the pad oxide layer pattern 102a are partially removed using the third photoresist pattern 116 as an etching mask to form a second opening 120 that partially exposes a top surface of the active region 106. As a result, the sidewalls and the top surface of the active region 106 of the substrate 100 that may be used in forming a fin type transistor is exposed by the first opening 118 and the second opening 120.

Figure 11A:
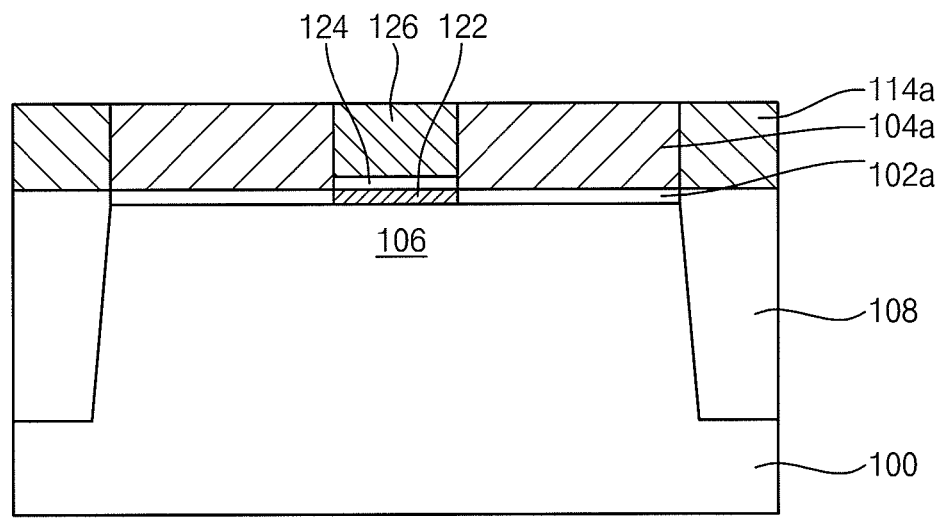
Figure 11B:
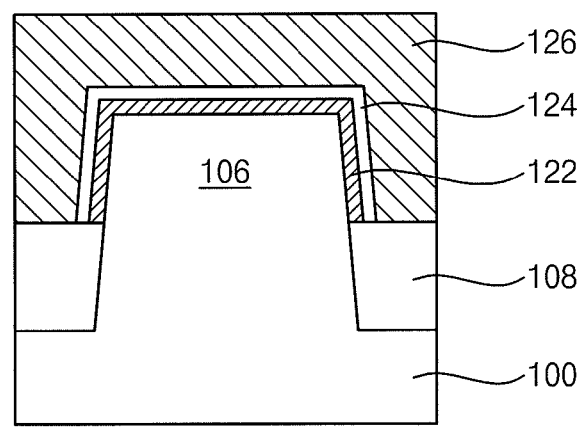

FIGS. 11A and 11B are cross-sectional views illustrating a channel layer, a gate insulation layer and a gate electrode formed on the exposed portion of the active region through the first and the second openings.

Referring to FIGS. 11A and 11B, a channel layer 122 is formed on the exposed portion of the active region 106 through the first opening 118 and the second opening 120. In an exemplary embodiment, the channel layer 122 may be formed by a selective epitaxial growth process using Group 14 elements such as, for example, silicon, silicon germanium, germanium, silicon carbide and the like. The channel layer 122 may be formed on the top surface and the sidewalls of the active region 106 in the second direction.

A gate insulation layer 124 is formed on the channel layer 122. The gate insulation layer 124 may be formed using an insulation material such as, for example, a high-dielectric material, silicon oxide, silicon oxynitride or combinations thereof. In an exemplary embodiment, when the channel layer 122 is formed using single crystal silicon, the gate insulation layer 124 may be formed by thermally oxidizing the single crystal silicon of the channel layer 122.

A gate electrode 126 is formed on the gate insulation layer 124 using a conductive material. In an exemplary embodiment, a conductive layer may be formed on the substrate 100 having the gate insulation layer 124 and the first and the second silicon nitride layer patterns 104a and 114a to fill the first opening 118 and the second opening 120, and then an upper portion of the conductive layer may be removed until the first silicon nitride layer pattern 104a is exposed to form the gate electrode 126 filling the first opening 118 and the second opening 120. For example, the gate electrode 126 may be formed using a conductive material such as doped polysilicon, metal, metal nitride, metal silicide and the like.

Figure 12:
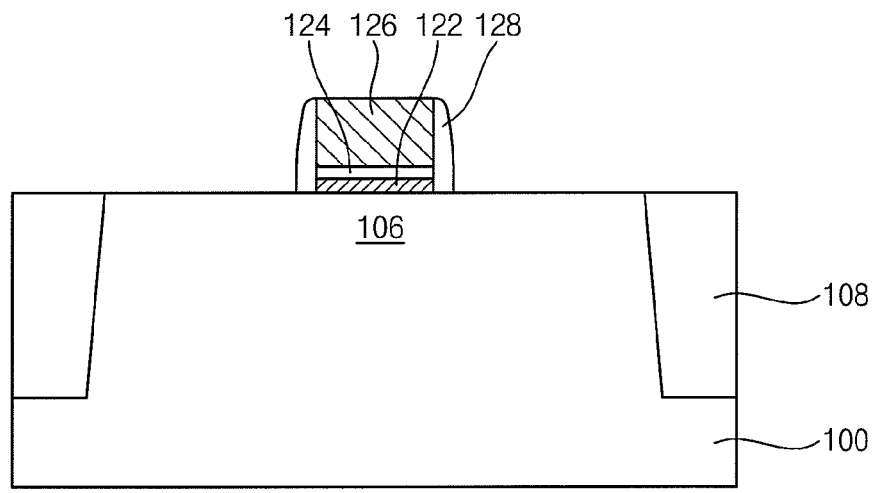
Figure 13:
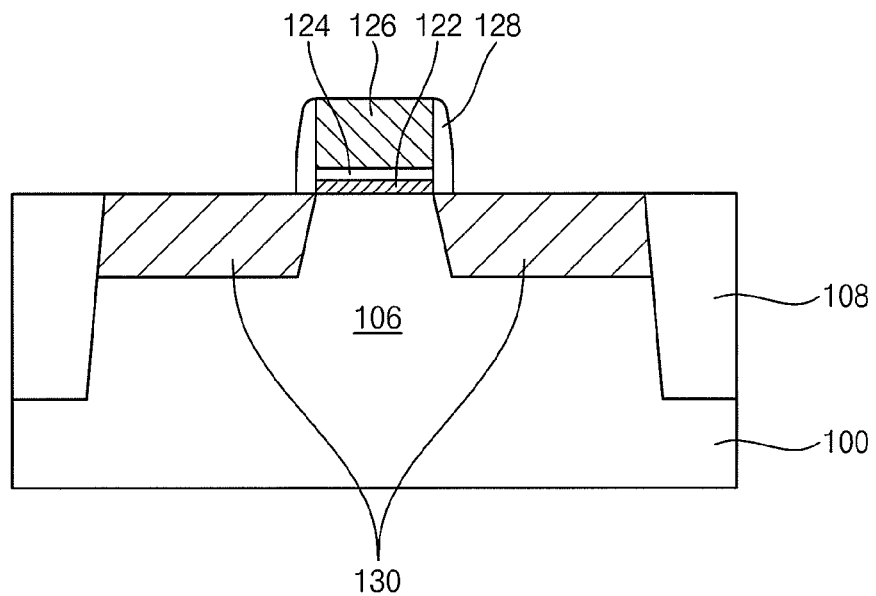

FIG. 12 is a cross-sectional view illustrating a gate spacer formed on sidewalls of the gate electrode, and FIG. 13 is a cross-sectional view illustrating a source/drain region formed in the active region adjacent to a gate structure.

Referring to FIGS. 12 and 13, the first silicon nitride layer pattern 104a and the second silicon nitride layer pattern 114a are removed by a stripping process and then an insulation layer is formed to cover the gate electrode 126. An anisotropic etching process may be performed on the insulation layer to form a gate spacer 128 on sidewalls of the gate electrode 126 in the first direction.

An ion implantation process is performed on the substrate 100 to form a source/drain region 130 on the active region 106 adjacent to the gate electrode 126 in the first direction. As a result, a semiconductor device having a fin-type transistor may be manufactured.

Exemplary embodiments of the present invention will be described through Examples and Comparative Examples, hereinafter. These are illustrative of exemplary embodiments of the present invention and are not intended to be limiting of the present invention.

Preparation of Slurry Compositions for Polishing Silicon Nitride

EXAMPLE 1

A slurry composition for polishing silicon nitride was prepared by mixing about 1 wt % of poly(acrylic acid) (PAA) having a weight-average molecular weight of about 2,000, about 0.5 wt % of a ceria abrasive particle, about 0.01 wt % of a carboxylic acid as a dispersion stability agent and a remainder of water. The pH of the slurry composition was adjusted to about 2.8 by adding a pH-controlling agent to the slurry composition. Sulfuric acid was used as an acidic pH-controlling agent, and potassium hydroxide was used as a basic pH-controlling agent.

EXAMPLE 2 THROUGH 10

Slurry compositions were prepared by performing processes substantially the same as those of Example 1 except that type and amount of the agent for reducing an oxide polishing rate and the pH of the slurry compositions were changed. Types and amount of the agent used in preparing the slurry composition and the pH of the slurry composition are shown in Table 1.

COMPARATIVE EXAMPLES 1 THROUGH 4

Slurry compositions were prepared by performing processes substantially the same as those of Example 1 except that no agent for reducing an oxide polishing rate was used in preparing the slurry composition and the pH of the slurry composition was changed. The pH of the slurry composition is shown in Table 1.

TABLE 1

|  | Agent for reducing an oxide polishing rate [wt %] | | |
| --- | --- | --- | --- |
|  | PAA | Hydrogen peroxide | pH |
| Example 1 | 1 | 0 | 2.8 |
| Example 2 | 1 | 2 | 2.8 |
| Example 3 | 1 | 0 | 4.5 |
| Example 4 | 1 | 2 | 4.5 |
| Example 5 | 1 | 0 | 7 |
| Example 6 | 1 | 2 | 7 |
| Example 7 | 1 | 0 | 10 |
| Example 8 | 1 | 2 | 10 |
| Example 9 | 1 | 2 | 2.8 |
| Example 10 | 1 | 5 | 2.8 |
| Comparative Example 1 | 0 | 0 | 2.8 |
| Comparative Example 2 | 0 | 0 | 4.5 |
| Comparative Example 3 | 0 | 0 | 7 |
| Comparative Example 4 | 0 | 0 | 10 |

Evaluation of Polishing Rates of a Silicon Nitride Layer and a Silicon Oxide Layer According to the Type of an Abrasive Particle To evaluate polishing rates of a silicon nitride layer and a silicon oxide layer according to the type of an abrasive particle, polishing processes were carried out using slurry compositions that included fumed silica, colloidal silica or ceria as the abrasive particle. The agent for reducing an oxide polishing rate was not used in the preparation of the slurry compositions, and the slurry compositions were prepared by mixing the abrasive particle, a carboxylic acid as a dispersion stabilizing agent and water. The type and the amount of the abrasive particle are shown in Table 2.

A silicon nitride layer was formed on a silicon wafer by a CVD process to have a thickness of about 1,000 Å. A silicon oxide layer was formed on a silicon wafer by a CVD process using plasma-enhanced tetraethyl orthosilicate (PE-TEOS) to have a thickness of about 15,000 Å. The polishing process was carried out using an EBARA 200 mm CMP equipment. Measured polishing rates of the silicon nitride layer and the silicon oxide layer are shown in Table 2.

TABLE 2

| Abrasive particle | | Polishing rate [Å/min] | | Polishing selectivity |
| --- | --- | --- | --- | --- |
| Type | [wt %] | Nitride | Oxide | (Nitride:Oxide) |
| Fumed Silica | 12 | 688 | 2,872 | 1:4.2 |
| Colloidal Silica | 30 | 755 | 2,211 | 1:3 |
| Ceria | 1 | 981 | 4,110 | 1:4.2 |

As shown in Table 2, the slurry composition including the ceria abrasive particle exhibited a polishing rate of silicon nitride substantially faster than those of the slurry compositions including fumed silica or colloidal silica. Therefore, the ceria abrasive particle can be used to enhance the polishing rate of the silicon nitride layer.

Additionally, it may be noted that the polishing rate of the silicon oxide is faster than the polishing rate of the silicon oxide layer regardless of the type of the abrasive particle when the agents for reducing an oxide polishing rate are not added to the slurry composition.

Evaluation of Polishing Rates of a Silicon Nitride Layer and a Silicon Oxide Layer According to the Size of a Ceria Abrasive Particle To evaluate polishing rates of a silicon nitride layer and a silicon oxide layer according to the size of a ceria abrasive particle, polishing processes were carried out using slurry compositions that included ceria abrasive particles having different sizes. No agent for reducing an oxide polishing was added to the slurry composition, and the slurry compositions were prepared by mixing a ceria abrasive particle, a dispersion stabilizing agent and water. The slurry compositions were prepared by substantially the same process, except that the average size of the ceria abrasive particle varied. The amount of the ceria abrasive particle was about 1 wt %, and the pH of the slurry composition was adjusted to about 5 using an acidic pH-controlling agent. The average sizes of the primary particle and the secondary particle, and the pH of the slurry composition are shown in Table 3.

The silicon nitride layer and the silicon oxide layer to be polished were prepared by performing processes substantially the same as those of the above-mentioned evaluation of polishing rates according to the type of the abrasive particle, and the polishing process was carried out using the same equipment. The measured polishing rates of the silicon nitride layer and the silicon oxide layer according to the average size of the ceria abrasive particle are shown in Table 3.

TABLE 3

| Particle size [nm] | | | Polishing rate [Å/min] | | Polishing selectivity |
| --- | --- | --- | --- | --- | --- |
| Primary | Secondary | pH | Nitride | Oxide | (Nitride:Oxide) |
| 20 | 150 | 5 | 112 | 2,417 | 1:22 |
| 20 | 200 | 5 | 201 | 2,391 | 1:12 |
| 50 | 150 | 5 | 318 | 3,110 | 1:10 |
| 50 | 200 | 5 | 311 | 3,051 | 1:10 |

As shown in Table 3, the polishing rate of the silicon nitride layer also increased as the average size of the primary particle increased. When the average size of the primary particle was the same as about 50 nm, the polishing rate of the silicon nitride layer slightly increased as the average size of the secondary particle decreased. Therefore, it may be noted that the polishing rate of the silicon nitride layer can be adjusted by changing the particle size of the ceria abrasive.

Evaluation of Polishing Rates of a Silicon Nitride Layer and a Silicon Oxide Layer According to Amounts of PAA and Hydrogen Peroxide and pH Variation To evaluate the polishing rate of a silicon nitride layer and a silicon oxide layer according to the amounts of PAA and hydrogen peroxide and pH variation, polishing processes were carried out using the slurry compositions prepared in Examples 1 through 8 and Comparative Examples 1 through 4.

The silicon nitride layer and the silicon oxide layer to be polished were prepared by performing processes substantially the same as those of the above-mentioned evaluation of polishing rates according to the type of the abrasive particle, and the polishing process was carried out using the same equipment. The measured polishing rates of the silicon nitride layer and the silicon oxide layer are shown in Table 4 and FIG. 14.

TABLE 4

| | PAA [wt %] | $H_2O_2$ [wt %] | pH | Polishing rate [Å/min] | | Polishing selectivity |
| --- | --- | --- | --- | --- | --- | --- |
| | | | | Nitride | Oxide | (Nitride:Oxide) |
| Example 1 | 1 | 0 | 2.8 | 950 | 107 | 9:1 |
| Example 2 | 1 | 2 | 2.8 | 1,034 | 53 | 20:1 |
| Comparative Example 1 | 0 | 0 | 2.8 | 991 | 387 | 2.6:1 |
| Example 3 | 1 | 0 | 4.5 | 318 | 187 | 2:1 |
| Example 4 | 1 | 2 | 4.5 | 192 | 63 | 3:1 |
| Comparative Example 2 | 0 | 0 | 4.5 | 445 | 2,915 | 0.15:1 |
| Example 5 | 1 | 0 | 7 | 136 | 234 | 0.6:1 |
| Example 6 | 1 | 2 | 7 | 72 | 78 | 1:1 |
| Comparative Example 3 | 0 | 0 | 7 | 512 | 3,233 | 0.16:1 |
| Example 7 | 1 | 0 | 10 | 291 | 811 | 0.4:1 |
| Example 8 | 1 | 2 | 10 | 168 | 124 | 1.4:1 |
| Comparative Example 4 | 0 | 0 | 10 | 633 | 3,579 | 0.18:1 |

Figure 14:
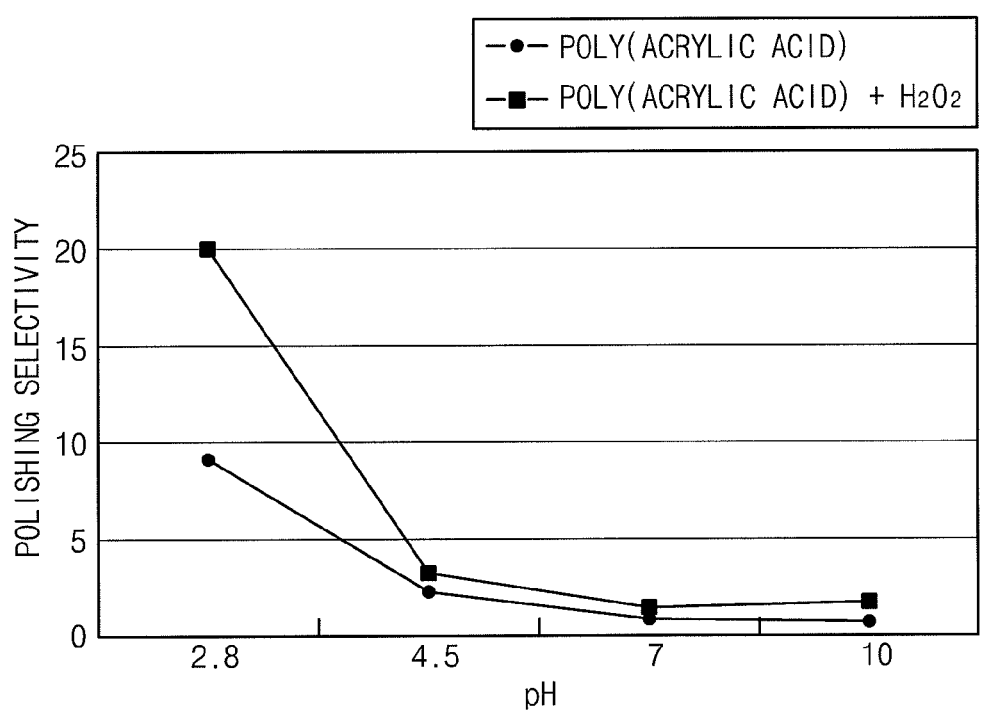
FIG. 14 is a graph illustrating a polishing selectivity of a silicon nitride layer relative to a silicon oxide layer according to the addition of agents for reducing an oxide polishing rate and the pH variation of the slurry composition.

FIG. 14 is a graph illustrating a polishing selectivity of a silicon nitride layer relative to a silicon oxide layer according to the addition of agents for reducing an oxide polishing rate and the pH variation of the slurry composition.

Referring to Table 4 and FIG. 14, the polishing selectivity of the silicon nitride layer relative to the silicon oxide layer rapidly increased as the pH of the slurry composition decreased. When the slurry compositions including neither PAA nor $H_2O_2$ prepared in Comparative Examples 1 through 4 were compared, the polishing rate of the silicon nitride layer was slower that the polishing rate of the silicon oxide layer at the pH of about 4.5, and the polishing rate of the silicon nitride layer was about 2.6 times faster than the polishing rate of the silicon oxide layer at the pH of about 2.8.

When PAA was added to the slurry composition as the agent for reducing the oxide polishing rate, the polishing rate of the silicon oxide layer greatly decreased relative to the polishing rate of the silicon nitride layer, and the polishing selectivity of silicon nitride largely increased. When the pH of the slurry composition was higher than about 4.5, both the polishing rate of the silicon oxide layer and the silicon nitride layer decreased together but a decrement of the polishing rate of the silicon oxide layer was substantially larger than a decrement of the polishing rate of the silicon nitride layer. When the pH of the slurry composition was about 2.8, the polishing rate of the silicon oxide layer greatly decreased whereas the polishing rate of the silicon nitride layer slightly decreased, and thus the polishing selectivity of the silicon nitride layer relative to the silicon oxide layer rapidly increased. Therefore, it may be noted that PAA has an excellent property of inhibiting or suppressing the polishing of the silicon oxide layer to reduce the polishing rate of the silicon oxide layer, and enhancing the polishing selectivity of the silicon nitride layer relative to the silicon oxide layer. Further, it may be also noted that the property of reducing the oxide polishing rate of PAA may be improved at a strong acidic pH condition of lower than about 4.5, such as, for example, a pH of about 2.8, 3 or 4.

When hydrogen peroxide was added to the slurry composition as the agent for reducing an oxide polishing rate, the polishing rate of the silicon oxide layer additionally decreased to enhance the polishing selectivity of the silicon nitride layer relative to the silicon oxide layer. When the pH of the slurry composition was at about 2.8, the addition of hydrogen peroxide exhibited an increase of at least about two times in the polishing selectivity of the silicon nitride layer relative to the silicon oxide layer.

Evaluation of Polishing Rates of a Silicon Nitride Layer and a Silicon Oxide Layer According to the Amount of Hydrogen Peroxide To evaluate polishing rates of a silicon nitride layer and a silicon oxide layer according to the amount of hydrogen peroxide, polishing processes were performed using the slurry compositions prepared in Examples 1, 2, 9 and 10. The silicon nitride layer and the silicon oxide layer to be polished were prepared by performing processes substantially the same as those of the above-mentioned evaluation of polishing rates according to the type of the abrasive particle, and the polishing process was carried out using the same equipment. The measured polishing rates of the silicon nitride layer and the silicon oxide layer are shown in Table 5 and FIG. 15.

TABLE 5

| | pH | PAA [wt %] | $H_2O_2$ [wt %] | Polishing rate [Å/min] | | Polishing selectivity |
| --- | --- | --- | --- | --- | --- | --- |
| | | | | Nitride | Oxide | (Nitride:Oxide) |
| Example 1 | 2.8 | 1 | 0 | 950 | 107 | 9:1 |
| Example 2 | 2.8 | 1 | 1 | 1,034 | 53 | 20:1 |
| Example 9 | 2.8 | 1 | 2 | 1,051 | 49 | 21:1 |
| Example 10 | 2.8 | 1 | 5 | 1,077 | 51 | 21:1 |

Figure 15:
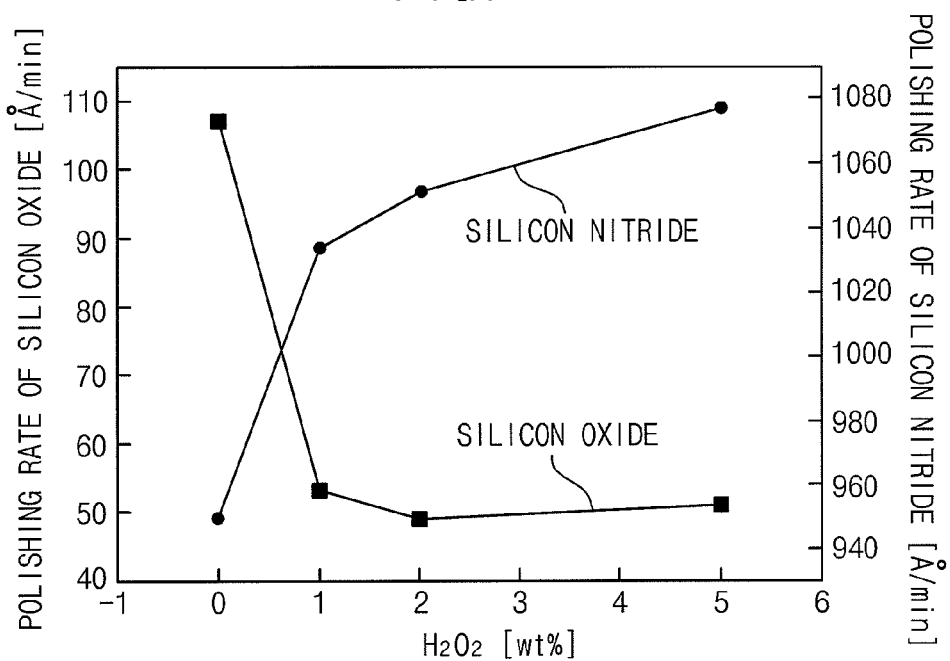
FIG. 15 is a graph illustrating polishing rates of a silicon nitride layer and a silicon oxide layer according to the amount variation of hydrogen peroxide.

FIG. 15 is a graph illustrating polishing rates of a silicon nitride layer and a silicon oxide layer according to the amount variation of hydrogen peroxide.

Referring to Table 5 and FIG. 15, due to the addition of hydrogen peroxide, the polishing rate of the silicon oxide layer decreased to at least 50% whereas the polishing rate of the silicon nitride layer slightly increased. Accordingly, the polishing selectivity of the silicon nitride relative to the silicon oxide layer increased to at least about two times. Additionally, as the amount of hydrogen peroxide increased, the polishing rate of the silicon oxide layer was not largely changed. Therefore, it may be noted that hydrogen peroxide may have a property of reducing the oxide polishing rate but such property may not be improved in proportion to the amount of hydrogen peroxide.

Evaluation of Polishing Rates of a Silicon Nitride Layer and a Silicon Oxide Layer According to the Amount of the Ceria Abrasive Particle To evaluate polishing rates of a silicon nitride layer and a silicon oxide layer according to the amount of a ceria abrasive particle, polishing processes were performed using slurry compositions that had different amounts of the ceria abrasive particle. The amount of the ceria abrasive particle was changed to about 0.1 wt %, about 0.25 wt %, about 0.5 wt % or about 1 wt %. The slurry compositions were prepared to include the ceria abrasive, about 1 wt % of PAA, about 2 wt % of hydrogen peroxide, about 0.01 wt % of a dispersion stabilizing agent of a carboxylic acid and a remainder of water. The pH of the slurry compositions was adjusted to about 2.8. The silicon nitride layer and the silicon oxide layer to be polished were prepared by performing processes substantially the same as those of the above-mentioned evaluation of polishing rates according to the type of the abrasive particle, and the polishing process was carried out using the same equipment. The measured polishing rates of the silicon nitride layer and the silicon oxide layer are shown in Table 6 and FIG. 16.

TABLE 6

| Ceria abrasive [wt %] | Silicon nitride [Å/min] | Silicon oxide [Å/min] | Polishing selectivity (Nitride:Oxide) |
| --- | --- | --- | --- |
| 0.1 | 1,195 | 41 | 29:1 |
| 0.25 | 1,146 | 44 | 26:1 |
| 0.5 | 994 | 51 | 19:1 |
| 1 | 798 | 65 | 12:1 |

Figure 16:
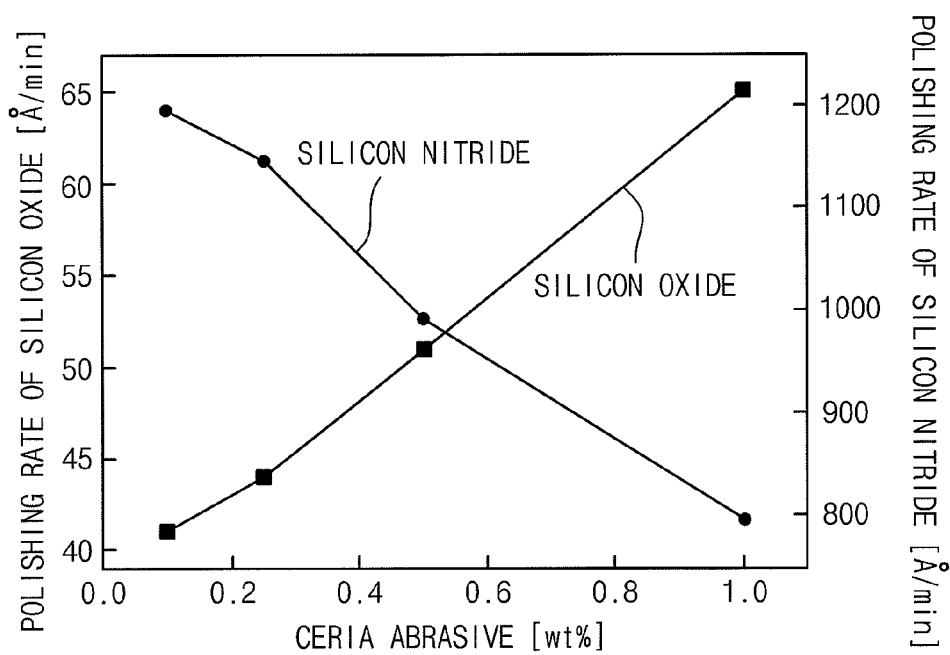
FIG. 16 is a graph illustrating polishing rates of a silicon nitride layer and a silicon oxide layer according to the amount variation of a ceria abrasive particle.

FIG. 16 is a graph illustrating polishing rates of a silicon nitride layer and a silicon oxide layer according to the amount variation of a ceria abrasive particle.

Referring to Table 6 and FIG. 16, as the amount of the ceria abrasive particle decreased from about 1 wt % up to about 0.1 wt %, the polishing rate of the silicon nitride layer linearly increased and the polishing selectivity of the silicon nitride layer relative to the silicon oxide layer also increased to at least about two times. Accordingly, the polishing selectivity of the silicon nitride layer relative to the silicon oxide layer may be improved by reducing the amount of the ceria abrasive particle. Further, in some exemplary embodiments, the amount of the ceria abrasive particle may be less than about 1 wt %,. In addition, in other exemplary embodiments, the amount of the ceria abrasive particle may be in a range of less than about 0.6 wt %, for example, about 0.5 wt %, about 0.25 wt % or about 0.1 wt %.

According to exemplary embodiments of the present invention, the slurry compositions including agents for reducing an oxide polishing rate may have a polishing rate of silicon nitride of about at least five times to at least about twenty times faster than a polishing rate of silicon oxide. Therefore, the slurry composition may be employed in polishing a silicon nitride layer relative to a silicon oxide layer in a semiconductor manufacturing process. The slurry composition may suppress or reduce damage to the silicon oxide layer while the silicon nitride layer being polished, and may also improve the surface planarity and the polishing uniformity of the silicon nitride layer.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of polishing a silicon nitride layer comprising:
   forming a silicon nitride layer on a substrate having a silicon oxide layer; and
   polishing the silicon nitride layer by using the silicon oxide layer as a polishing stop layer and applying to the substrate a slurry composition including a first agent for reducing an oxide polishing rate, an abrasive particle, a second agent for reducing an oxide polishing rate and water, the first agent including poly(acrylic acid) and the second agent including a peroxide compound.

2. The method of claim 1, wherein the slurry composition has a polishing rate of the silicon nitride layer of at least about five times faster than a polishing rate of the silicon oxide layer.

3. The method of claim 1, wherein the slurry composition has a pH in a range of about 1 to about 4.

4. The method of claim 1, wherein the slurry composition has a pH of lower than about 4.5.

5. The method of claim 1, wherein the silicon oxide layer is formed to have a recess and the silicon nitride layer is formed on the silicon oxide layer to fill the recess.

6. A method of manufacturing a semiconductor device comprising:
   forming a first silicon nitride layer pattern on a substrate to have a length extending along the substrate in a first direction;
   partially etching the substrate using the first silicon nitride layer pattern as an etching mask to form a trench at an upper portion of the substrate;
   forming a silicon oxide layer to fill the trench and to define an active region of the substrate;
   removing a portion of the silicon oxide layer adjacent to both ends of the active region in the first direction to form a recess in the silicon oxide layer;
   forming a second silicon nitride layer on the first silicon nitride layer pattern and the silicon oxide layer to fill the recess; and
   polishing the second silicon nitride layer using a slurry composition until the silicon oxide layer is exposed to form a second silicon nitride layer pattern that fills the recess, the slurry composition including a first agent for reducing an oxide polishing rate, an abrasive particle and water, the first agent including poly(acrylic acid).

7. The method of claim 6, wherein the slurry composition has a polishing rate of the silicon nitride layer of at least about five times faster than a polishing rate of the silicon oxide layer.

8. The method of claim 6, after forming the second silicon nitride layer pattern, further comprising:
   removing a portion of the silicon oxide layer adjacent to the active region in a second direction perpendicular to the first direction to form a first opening exposing sidewalls of the active region in a second direction;

partially removing the first silicon nitride layer pattern to form a second opening exposing a portion of an upper surface of the active region; and sequentially forming a gate insulation layer and a gate electrode on the active region exposed by the first and the second openings to form a gate structure on the active region.

9. The method of claim 8, wherein the forming of the first opening comprises:

forming a photoresist pattern on the first and the second silicon nitride layers and the silicon oxide layer, the photoresist pattern extending in a second direction and exposing portions of the first silicon nitride layer pattern and the silicon oxide layer in the second direction; and removing an exposed portion of the silicon oxide layer by performing a dry etching process using the photoresist pattern and the first silicon nitride layer pattern as etching masks to form the first opening exposing sidewalls of the active region in the second direction.

* * * * *